(12) United States Patent
Park et al.

(10) Patent No.: US 7,173,872 B2
(45) Date of Patent: Feb. 6, 2007

(54) METHOD AND APPARATUS FOR CONTROLLING A HIGH VOLTAGE GENERATOR IN A WAFER BURN-IN TEST

(75) Inventors: Choong-Sun Park, Kyunggi-do (KR); Hyung-Dong Kim, Kyunggi-do (KR); Sang-Seok Kang, Kyounggi-do (KR); Jong-Hyun Choi, Seoul (KR); Yong-Hwan Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/327,104

(22) Filed: Jan. 5, 2006

(65) Prior Publication Data

US 2006/0114731 A1 Jun. 1, 2006

Related U.S. Application Data

(62) Division of application No. 10/423,505, filed on Apr. 25, 2003, now Pat. No. 7,016,248.

(30) Foreign Application Priority Data

Apr. 26, 2002 (KR) ................ 2002-23042
Sep. 10, 2002 (KR) ................ 2002-54429

(51) Int. Cl.
*G11C 7/00* (2006.01)
*G11C 8/00* (2006.01)

(52) U.S. Cl. ............ 365/226; 365/189.09; 365/189.07; 327/374

(58) Field of Classification Search ................ 365/226, 365/189.07, 189.09; 327/374
See application file for complete search history.

(56) References Cited

U.S. PATENT DOCUMENTS

| 5,424,990 | A | 6/1995 | Ohsawa |
| 5,754,418 | A | 5/1998 | Park et al. |
| 5,796,287 | A | 8/1998 | Furutani et al. |
| 6,372,528 | B1 | 4/2002 | Yamamoto |
| 6,480,426 | B2 * | 11/2002 | Atsumi et al. ......... 365/189.05 |
| 6,700,817 | B2 * | 3/2004 | Atsumi et al. ......... 365/185.09 |

* cited by examiner

*Primary Examiner*—Son T. Dinh
(74) *Attorney, Agent, or Firm*—Marger Johnson & McCollom, P.C.

(57) ABSTRACT

The invention relates to a method and apparatus for controlling a high voltage generator during wafer burn-in. The method includes generating an enable signal for enabling a high voltage generator responsive to a mode signal, e.g., a wafer burn-in test mode. The method provides an external voltage to a semiconductor memory device through a pad responsive to the enable signal. The method varies a high voltage level being output from the high voltage generator in response to a reference voltage level.

10 Claims, 9 Drawing Sheets

METHOD AND APPARATUS FOR CONTROLLING A HIGH VOLTAGE GENERATOR IN A WAFER BURN-IN TEST

This application is a divisional of U.S. patent application Ser. No. 10/423,505, filed Apr. 25, 2003 now U.S. Pat. No. 7,016,248, now pending, which claims priority from Korean Patent Application No. 2002-23042, filed Apr. 26, 2002, and Korean Patent Application No. 2002-54429, filed Sep. 10, 2002, the contents of which are herein incorporated by reference in their entirety.

BACKGROUND OF THE INVENTION

1. Field of the Invention

The present invention relates to a method and apparatus adapted to apply a high test voltage to a semiconductor device, and more particularly, to a method and apparatus for controlling a high voltage generator for use in a wafer burn-in test.

2. Discussion of Related Art

A burn-in test is typically applied to a volatile semiconductor memory device such as a dynamic random access memory and the like (DRAM). The burn-in test accelerates failure modes if they exist, by applying short duration high voltage and temperature stresses to the device under test. After the test application, the device is evaluated. Chips containing weak or faulty cells or chips having electronic characteristics deviating from acceptable distributions are screened out.

A wafer burn-in test is disclosed in a patent to Yamamoto (U.S. Pat. No. 6,372,528) issued Apr. 16, 2002. The burn-in test requires a stress voltage VPP that is higher than the voltages VDD used by the device during normal operation. The stress voltage VPP is generally generated by a high voltage generator that is provided on the semiconductor memory device itself.

FIG. 1 is a block diagram of a high voltage generator. Referring to FIG. 1, the high voltage generator 100 comprises a ring oscillator 10, a charge pump 20, and a level detecting circuit 30. The level detecting circuit 30 generates a detection signal by comparing a high voltage VPP with a reference voltage Ref. The detection signal represents an extent of a level rise or a level drop of the high voltage VPP. The ring oscillator 10 generates clocks CK,/CK for use in generating the high voltage VPP responsive, in turn, to the detection signal outputted from the level detecting circuit 30. The charge pump 20 performs a charge pumping operation responsive to the clocks CK,/CK and thus outputs the high voltage VPP that traces to the reference voltage Ref.

The high voltage generator 100 is widely used in wafer burn-in test, and threshold voltage loss compensation caused by driving a DRAM wordline or by using an N-type MOS transistor.

To reduce wafer burn-in test time, a high level of an external voltage source EVDD is applied to the semiconductor memory device. The external voltage source EVDD rises at a same slope as a high voltage. When the external power voltage EVDD is output at too high a level, a gate oxide film of a memory cell transistor breaks down or has a punch through phenomenon.

That is, in the high voltage generator of FIG. 1, when a voltage difference between the external power voltage EVDD and the reference voltage VRef is more than a predetermined voltage difference during burn-in, the reference voltage is increased proportionately to an increase of the external power voltage EVDD, which causes an increase in the high voltage applied for the burn-in test. These increases breakdown the gate oxide film of the transistor or cause a punch through phenomenon.

A semiconductor memory device employs a substrate bias voltage generator for generating a substrate bias voltage. The substrate bias voltage (hereinafter "VBB") has a negative voltage level as compared to the voltage source VDD. The VBB generator, therefore, is also termed a negative drop voltage generator.

Three primary reasons for supplying the bias voltage VBB to the substrate exist. First, the bias voltage VBB prevents circuit elements P/N junctions from partially forward biasing, thereby preventing data loss, latch up, and the like in memory cells. Second, the bias voltage VBB stabilizes the device by reducing threshold voltage changes related to a back gate effect in a MOS transistor. Finally, the bias voltage VBB improves operating speed by increasing a threshold voltage of a parasitic MOS transistor. The increased threshold voltage improves the consistency of a channel stop implant provided under a field oxide layer.

The negative drop voltage generator comprises a ring oscillator, a charge pump, and a level detector, similarly to the construction of the high voltage generator.

The level detector detects the negative drop voltage VBB received by feedback, and outputs a detection signal that represents the extent of a level rise or fall of the negative drop voltage VBB. The ring oscillator generates clock signals corresponding to the detection signal outputted from the level detector. The charge pump performs a charge pumping operation responsive to the clock signals, to thus output, as the VBB, the negative drop voltage VBB having a negative voltage level.

During wafer burn-in, the bias voltage VBB is applied substantially higher or lower than at any other time including during operation. If a voltage lower than the bias voltage VBB is applied externally through a VBB pad, the level detector within the negative drop voltage generator can continuously operate on the basis of a difference between the external and internally generated voltage level. The result is an irregular VBB on some regions of the substrate. That is, VBB appears inconsistently on the substrate. This, in turn, results in reduced test coverage for a refresh operation and a consequent reduction in device reliability.

Accordingly, a need remains for a high voltage generator that maintains constant a voltage during predetermined modes of operations such as burn-in. And a need remains for an improved negative drop voltage generator.

SUMMARY OF THE INVENTION

An object of the present invention is to overcome the disadvantages associated with known high voltage generators. Accordingly, the present invention is directed to a method for controlling a high voltage generator for use in a wafer burn-in test and a high voltage generator controlling circuit that substantially obviates one or more of the limitations and disadvantages of the related art.

Another object of the present invention is to provide an apparatus and a method for controlling a high voltage generator for use in a wafer burn-in test.

Yet another object of the present invention is to provide an apparatus and a method for maintaining constant a rate of increase of high voltage even where an external power voltage is applied during a burn-in test.

Yet another object of the present invention is to provide an apparatus and a method in which all factors unstably influencing the semiconductor memory device are eliminated.

Yet another object of the present invention is to provide an apparatus and a method for shortening a wafer burn-in test time by outputting a uniform or constant high voltage even with a heightened external power voltage.

A method for controlling a high voltage generator in a semiconductor memory device is provided. The method comprises disabling a high voltage generator responsive to a mode signal and applying an external voltage to the semiconductor memory device responsive to the disabling. The disabling includes disabling a high voltage generator responsive to a wafer burn-in test mode signal. Disabling the high voltage generator includes disabling the high voltage generator after stabilizing the externally applied voltage.

A method for controlling high voltage generators having voltage level detectors in a semiconductor memory device is also provided. The method comprises generating an enable signal for enabling a high voltage generator responsive to a mode signal; controlling a reference voltage level of the voltage level detectors responsive to the mode signal; and varying an output voltage from the generators in response to the reference voltage level. A semiconductor memory device is provided. The device comprises high voltage generator adapted to generate a high voltage and an operation enable detecting circuit adapted to disable the high voltage generator responsive to a mode signal. The external voltage is applied to the semiconductor memory device through a pad when the high voltage generator is disabled. The mode signal indicates a wafer burn-in test mode. The operation enable detecting circuit is adapted to completely disable the high voltage generator after the external voltage stabilizes. The operation enable detecting circuit includes a first inverter adapted to invert the mode signal, a second inverter adapted to invert a driving signal, and a NAND gate adapted to generate an generator enable signal by logically NANDing the inverted mode and driving signals.

An apparatus in a semiconductor memory device is provided. The apparatus comprises a high voltage generator including a level detecting circuit adapted to compare a reference voltage with a high voltage and to generate a detection signal responsive to the comparison, the detection signal signaling the high voltage to track the reference voltage. And a reference level controlling circuit is adapted to vary the reference voltage responsive to a mode signal. The mode signal indicates a wafer burn-in test. The reference level controlling circuit comprises a MOS transistor having a gate, a drain, and a source, the gate being adapted to receive the mode signal, the drain being adapted to receive the reference voltage, and the source being adapted to receive an original reference voltage. The reference level controlling circuit further comprises a MOS diode string connected in parallel to the MOS transistor and adapted to drop a level of the original reference voltage responsive to the mode signal. The reference level controlling circuit alternatively comprises a PMOS transistor having a gate, a drain, and a source, the gate being adapted to receive the mode signal, the drain being adapted to receive the reference voltage, and the source being adapted to receive an original reference voltage, and a resistive element connected in parallel to the PMOS transistor and adapted to drop a level of the original reference voltage responsive to the mode signal.

A method for controlling a high voltage generator that supplies an internal voltage to a semiconductor memory device is provided. The method includes cutting off the high voltage generator responsive to a mode signal and supplying an external voltage through a pad. Cutting off comprises cutting off the high voltage generator responsive to a mode signal indicative of a wafer burn-in test. Cutting off also comprises cutting off the high voltage generator a predetermined time after the high voltage generator supplies the internal voltage to the semiconductor memory device.

The high voltage generator includes a level detector and the method further comprises controlling a reference voltage level of a level detector responsive to the mode signal and modifying the internal voltage responsive to the mode signal. Controlling the reference voltage level is performed through at least one voltage drop element. Controlling the reference voltage level is performed through a plurality of serially connected P-type MOS diodes.

A semiconductor memory device is provided. The device comprises a high voltage generator for generating an internal high voltage, a disabling circuit adapted to disable the high voltage generator responsive to a mode signal, and a pad adapted to supply an external high voltage responsive to disabling the high voltage generator. The mode signal indicates a wafer burn-in test. The disabling circuit is adapted to progressively disable the high voltage generator according to a stabilization ramp of the external high voltage supplied to the pad.

A semiconductor memory device is provided. The device comprises a negative drop voltage generator adapted to generate a voltage lower than a normal voltage source, a disabling circuit adapted to cut off the negative drop voltage generator responsive to a mode signal, and a pad adapted to receive an external voltage responsive to the disabling of the negative drop voltage generator. The negative drop voltage generator includes a level detector adapted to supply a detection signal where the disabling circuit includes an inverter adapted to invert the detection signal and a NOR gate adapted to logically NOR the inverted detection signal and the mode signal.

BRIEF DESCRIPTION OF THE ATTACHED DRAWINGS

The foregoing and other objects, features, and advantages of the invention will become more readily apparent from the detailed description of an embodiment that references the following drawings.

DETAILED DESCRIPTION OF PREFERRED EMBODIMENT

Reference will now be made in detail to embodiments of the present invention, examples of which are illustrated in the accompanying drawings.

The constructive elements, which have the same or similar functions, are provided as the same or similar reference numbers and characters, even though they are shown on different drawings.

In one embodiment of the present invention, a high voltage generator is turned off only in wafer burn-in and an external high voltage is applied directly through a high voltage pad VPP PAD located within the memory chip.

Figure 2:
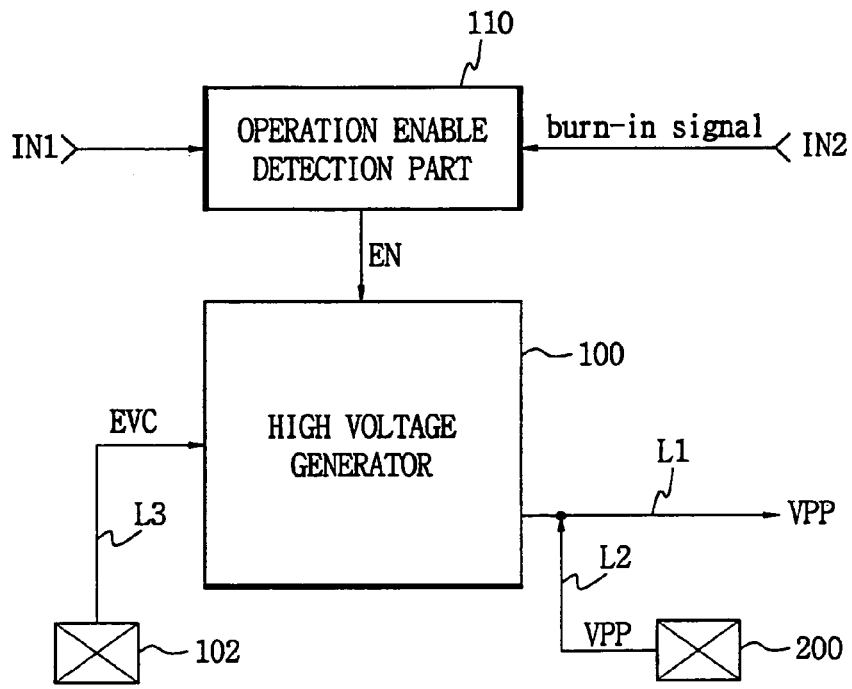
FIG. 2 is a block diagram of one embodiment of the high voltage generator of the present invention.

Referring to FIG. 2, a high voltage generator 100 generates a high voltage VPP higher than a normal power voltage. An external power voltage EVC is applied to a pad 102 and supplied to the high voltage generator 100 through a line L3. An operation enable deciding part 110 receives, through an inputting terminal IN2, a burn-in test mode signal and provides an enable signal to the high voltage generator 100 responsive thereto.

The high voltage VPP necessary for the burn-in test mode is externally applied directly to the required place in the memory chip through a pad 200 avoiding having to provide the high voltage through the high voltage generator 100.

Figure 1:
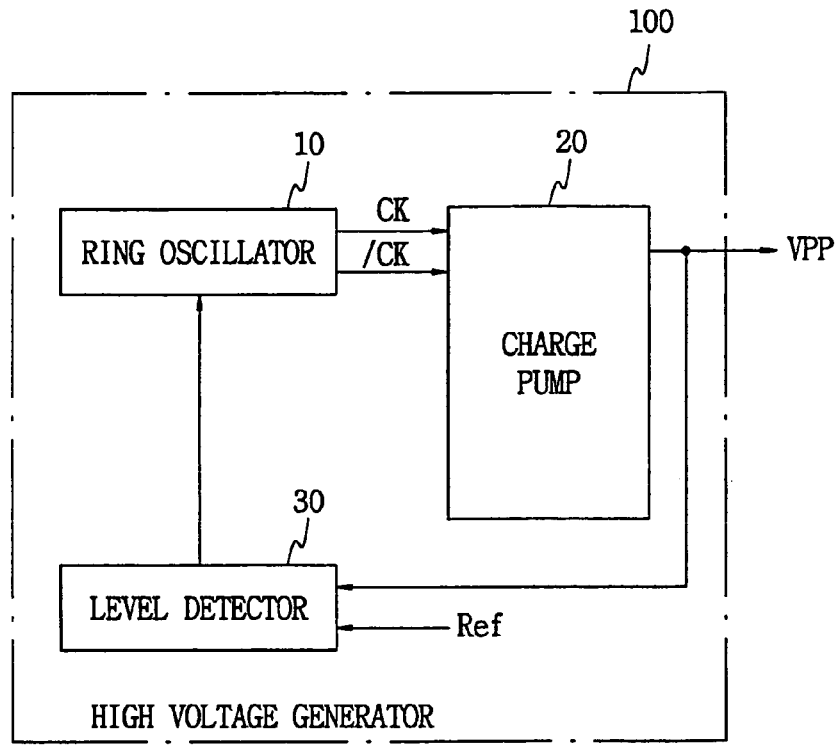
FIG. 1 is a block diagram of a high voltage generator.
Figure 3:
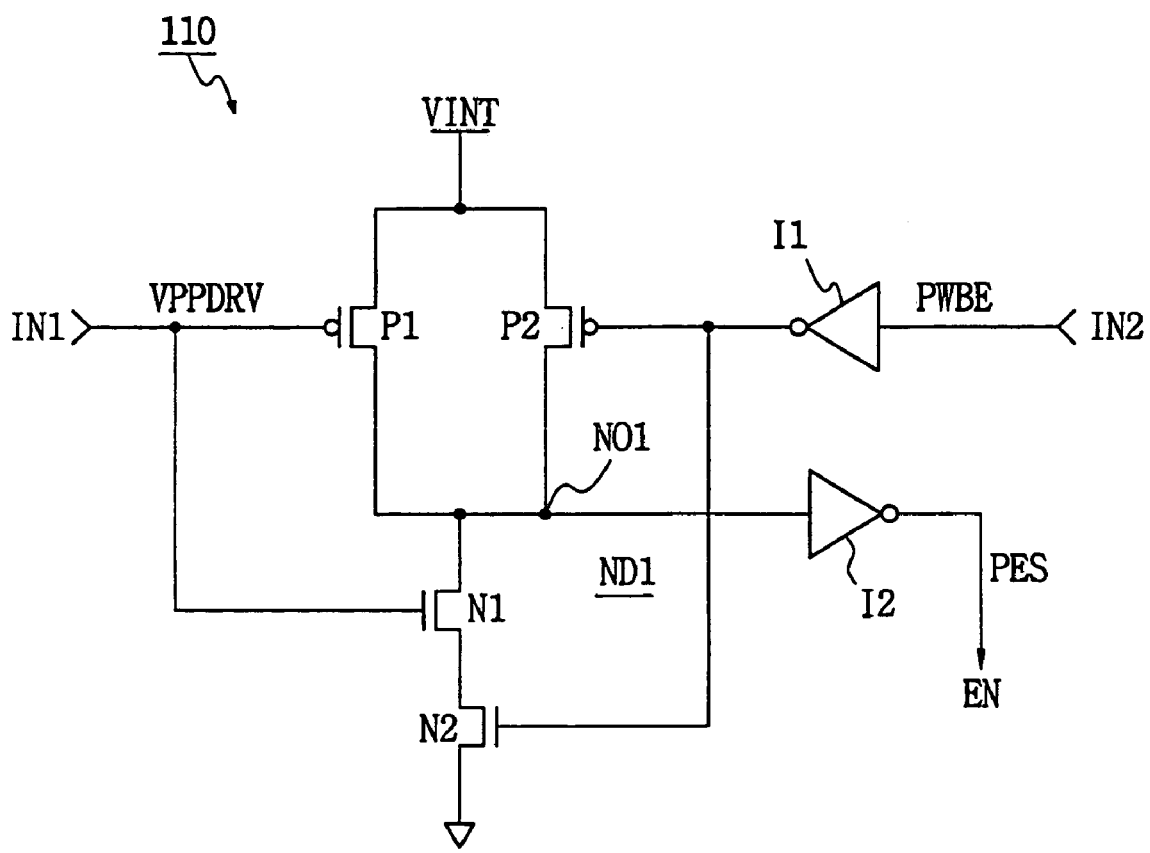
FIG. 3 is a circuit diagram of one embodiment of the operation enable detecting part shown in FIG. 2.

One embodiment of the operation enable deciding part 110 is shown in FIG. 3. With reference to FIG. 3, an inverter I1 inverts a signal PWBE that is applied through an inputting terminal IN2. An inverter I2 inverts the signal present at output node NO1 to generate an operation enable signal PES. A NAND gate ND1 logically NANDS the output of the inverter I1 with the driving signal VPPDRV received through an input terminal IN1. The NAND gate ND1 provides the signal to the output node NO1. The NAND gate ND1 includes P-type MOS transistors P1 and, P2 and N-type MOS transistors N1 and, N2. The driving signal VPPDRV might be a high voltage driving signal for driving a charge pump within the high voltage generator 100 (FIG. 1).

When the wafer burn-in test begins, the wafer burn-in enable signal PWBE, is generated inside the memory chip. When the PWBE signal is asserted through the inverter IN1, the high voltage generator 100 is cut off. Its detailed operation is described as follows.

For example, assume the main driving signal VPPDRV is provided as a logic "H" to operate the charge pump within the high voltage generator. In a case where the level of the main driving signal VPPDRV is provided as a logic "L", the high voltage generator does not generate a high voltage. Meanwhile, when the wafer burn-in test begins, the signal PWBE generated within the memory chip changes from "L" to "H". The NAND gate ND1 generates the operation enable signal PES responsive to the PWBE signal and the main driving signal VPPDRV. More specifically, the wafer burn-in test is not executed, the PWBE signal becomes "L" and, a logic state of the main driving signal VPPDRV remains intact and is transferred to an enable terminal of the high voltage generator 100. If the main driving signal VPPDRV is "H", the high voltage generator 100 operates and generates the high voltage.

When the PWBE signal becomes a logic "H" a wafer burn-in test is performed. Thus, regardless of the logic state of the main driving signal VPPDRV, a logic "L" is applied to the enable terminal of the high voltage generator 100 to cut off its operation.

It should be understood that logic levels are exemplary and can be switched. Although the generation of high voltage was stopped by cutting off the charge pump, a person of reasonable skill should understand that the generation of high voltage might be stopped by cutting off a ring oscillator or a level detecting part.

In one embodiment, the operation of the high voltage generator is cut off during wafer burn-in mode to allow the external application of high voltage VPP. The high voltage VPP, therefore, is tightly controlled and generated in an outside of the semiconductor memory device to be stably applied as a stress voltage during wafer burn-in. By doing so, a high voltage having a level higher than a regularized value is not permitted to be generated by the high voltage generator during burn-in. After burn-in, the generator operates to apply the high voltage VPP to a memory cell transistor and the like. The invention prevents gate oxide film breakdown and/or punch through in a transistor.

Another embodiment of the present invention will be described referring to FIGS. 4–6. In this embodiment, a reference voltage level of the level detecting part provided within the high voltage generator is controlled in the burn-in test, to thereby vary a level of the high voltage being outputted from the high voltage generator. Put differently, the reference voltage level of the level detecting part 30 varies so that a target level of the high voltage VPP can be controlled in the wafer burn-in test. The high voltage generator is therefore prevented from outputting the high voltage having a level higher than a regularized value. The high voltage generator heightens a level of the outside power voltage in the test operation so as to shorten test times.

Figure 4:
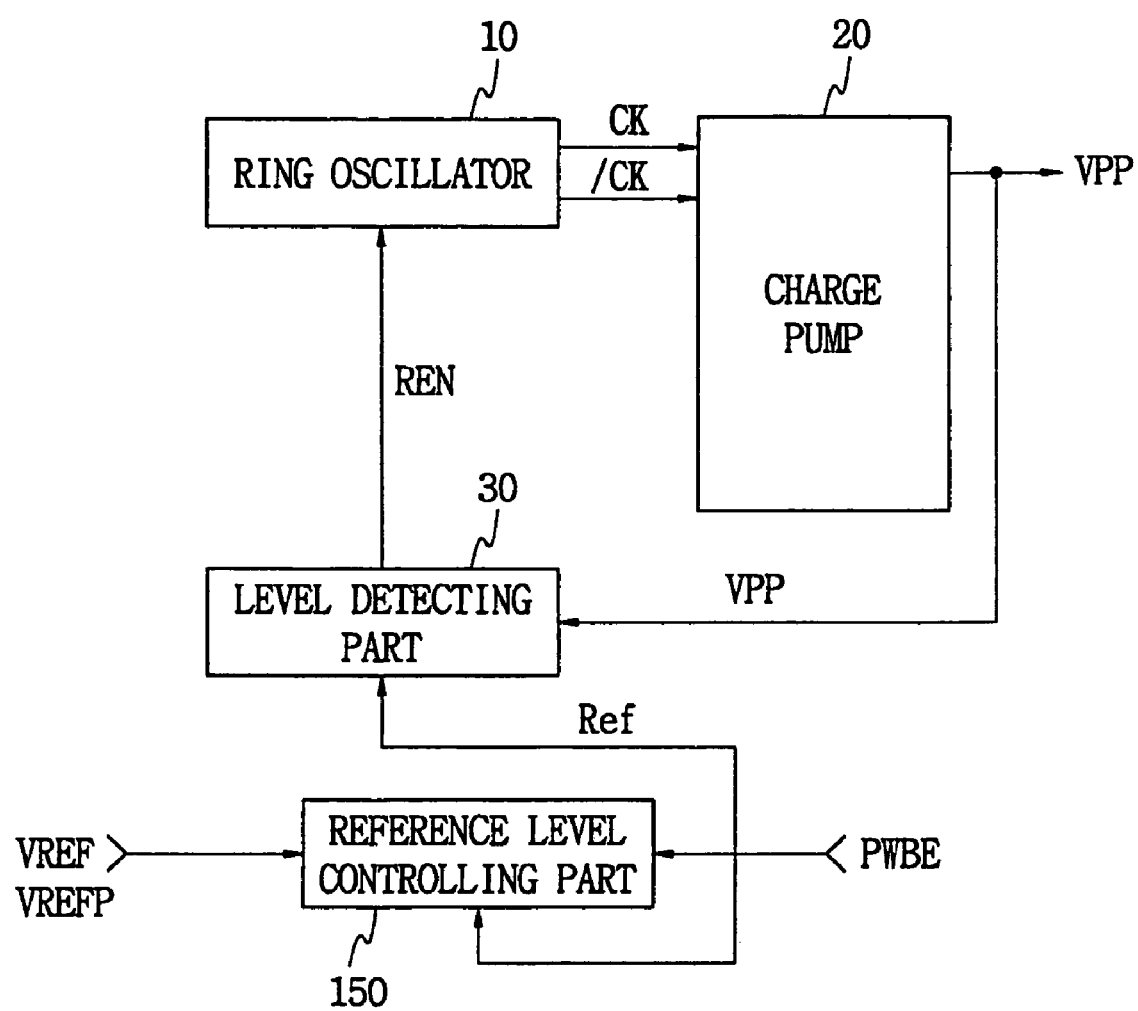
FIG. 4 is a block diagram of another embodiment of the high voltage generator of the present invention.

FIG. 4, it shows a block diagram of a high voltage generator and a circuit 150 for controlling a level detection operation of the high voltage generator. Referring to FIG. 4, a level detecting part 30 within the high voltage generator 100, which was described in FIG. 1, compares a level of reference voltage Ref with a level of feedback high voltage VPP, and outputs a detection signal REN. A reference level controlling part 150 varies the level of the reference voltage Ref to be applied to the level detecting part 30 in response to a signal PWBE. The signal PWBE indicates the burn-in test mode. Thus, the level of the high voltage VPP outputted through the high voltage generator 100 is varied only during the specific operational mode (burn-in test) by a level variation of the detection signal REN.

Figure 5:
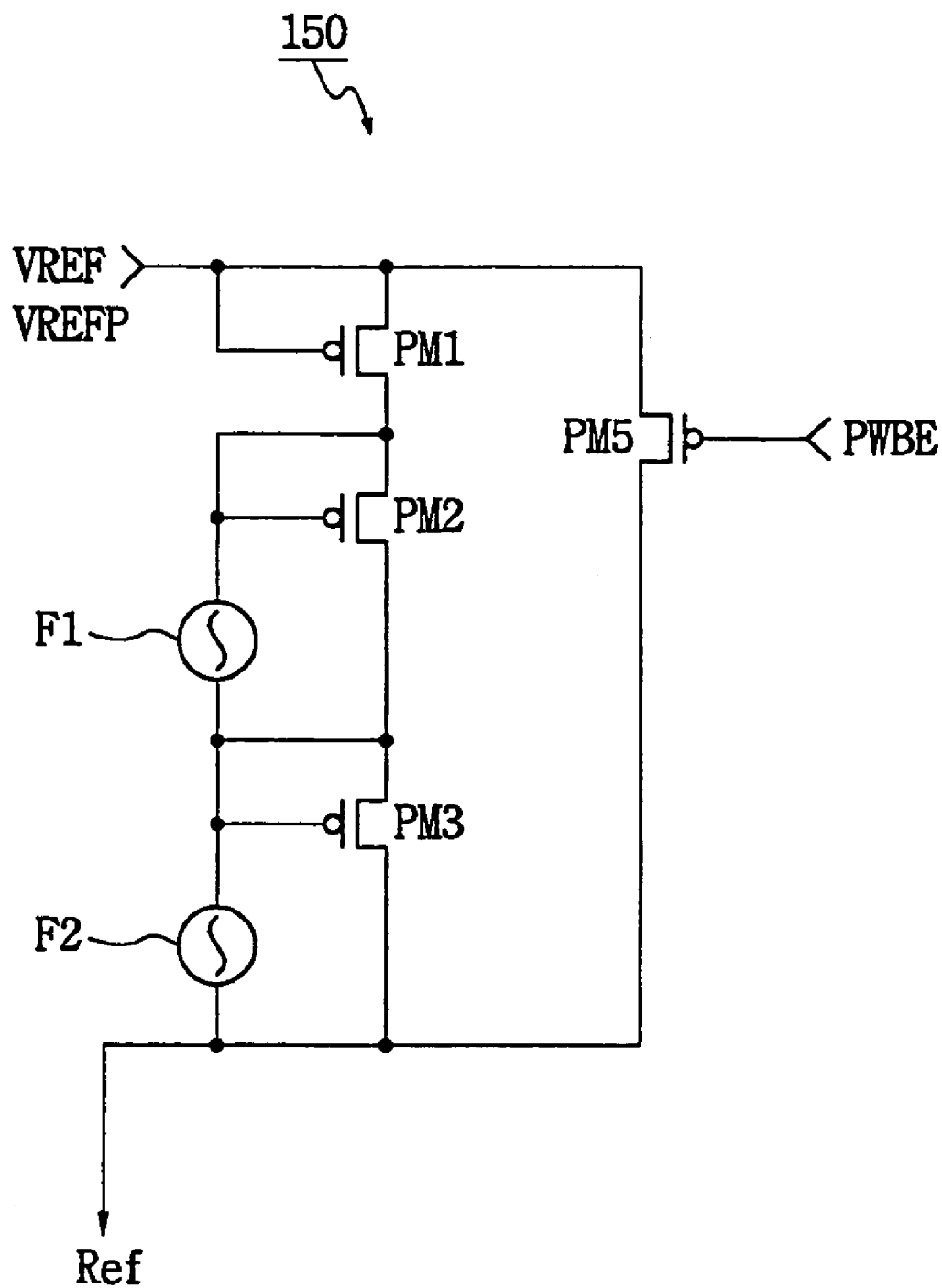
FIG. 5 is a circuit diagram of one embodiment of the reference level controlling part shown in FIG. 4.

FIG. 5 is a circuit diagram of an embodiment of the reference level controlling part 150 shown in FIG. 4. With reference to FIG. 5, a P-type MOS transistor PM5 receives an original reference voltage VREF, VREFP through a source terminal, receives the signal PWBE through a gate terminal and receives the reference voltage Ref through a drain terminal. A MOS diode string comprising transistors PM1, PM2, PM3, is connected in parallel with the MOS transistor PM5 and between an applying node of the original reference voltage VREF, VREFP and the reference voltage Ref input node. The diode string PM1, PM2, and PM3 drops a level of the original reference voltage VREF, VREFP only during the wafer burn-in test. Fuses F1 and F2, are respectively connected to gate terminals of the MOS diodes PM2 and PM3 are poly silicon fuses capable of being cut by a light source such as a laser beam or the like. Fuses F1 and F2 control a voltage drop in a setting step. The MOS diode string PM1, PM2, and PM3 can be replaced by serially connected resistance elements. A MOS diode is fabricated by building a MOS transistor with commonly connected source and gate terminals.

Figure 6:
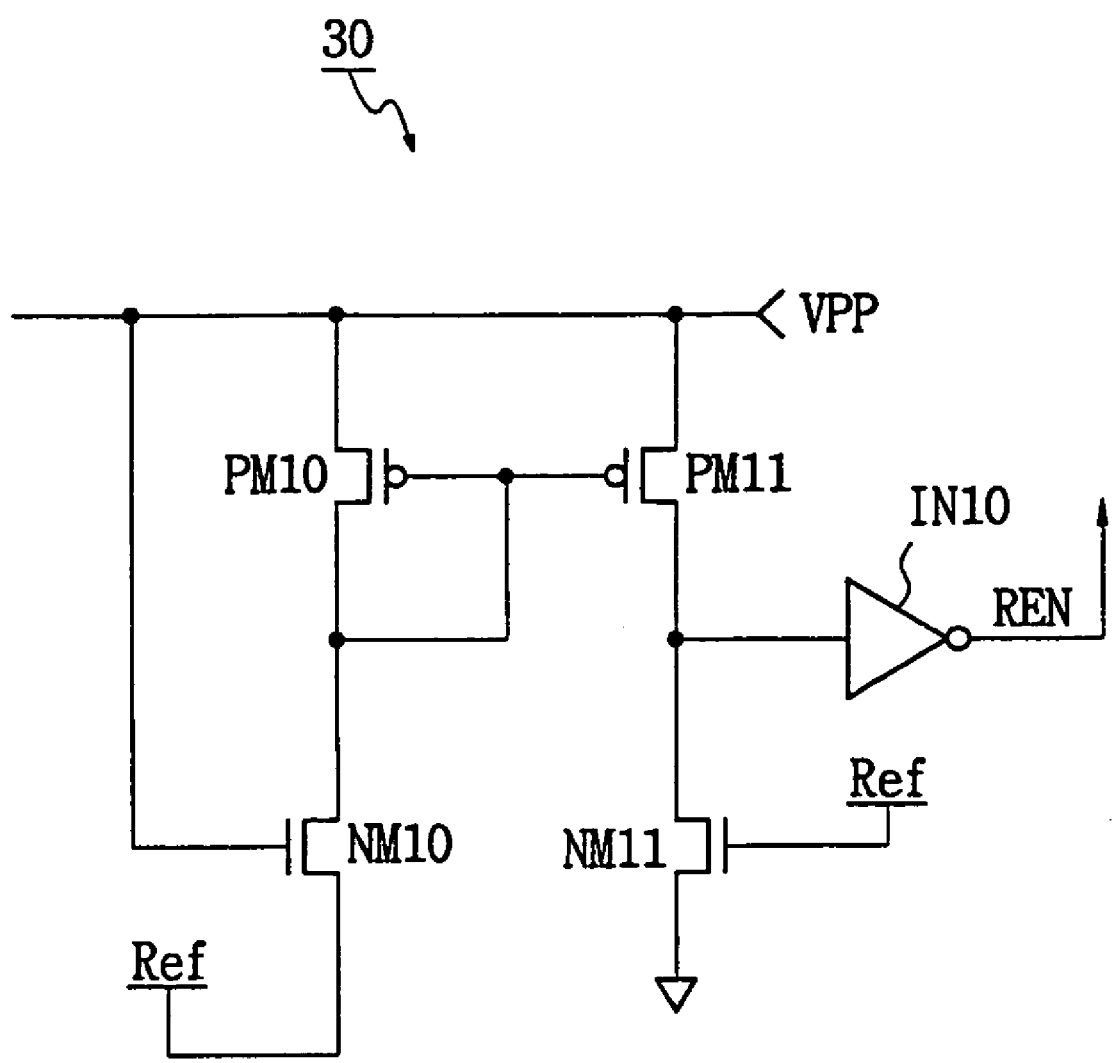
FIG. 6 is a circuit diagram of one embodiment of the level detecting part shown in FIG. 4.

FIG. 6 is a circuit diagram of the level detecting part 30 shown in FIG. 4. FIG. 6 is an example of how the reference voltage Ref outputted from FIG. 5 is applied to the level detecting part 30.

Returning to FIG. 5, reference voltages VREF, VREFP, VREFA, are applied to the gate and the source terminal of the diode PM1 and simultaneously applied to a source terminal of the P-type MOS transistor PM5.

In a non wafer burn-in test mode, the signal PWBE is at a logic "L", turning on the MOS transistor PM5. The original reference voltage VREF is provided as the reference voltage Ref through the MOS transistor PM5 without voltage level drop. This is because the voltage level drop by a threshold voltage (Vtp: Threshold Voltage of PMOS) does not occur when the P-type MOS transistor PM5 is turned on. Where there is no wafer burn-in test, there is no current flowing through the MOS diode string PM1, PM2, and PM3.

Importantly, in the burn-in test mode, the signal PWBE is at a logic "H", thus the voltage level of the reference voltage Ref is determined according to the number of diodes. That is, if it is assumed that all the fuses F1, F2 were cut, the respective diodes which form the MOS diode string PM1, PM2, and PM3 operate as resistance elements. For example, if the drop is voltage when passing through one diode is about 0.7 volt, the voltage dropped in passing through three diodes is about 2.1 volt. If the level of the original reference voltage VREF is 5 volt in the wafer burn-in a voltage of 2.9 volt is provided as the reference voltage Ref. after three diode drops. Where the fuses F1 and F2 are not cut, the voltage drops by only about 0.7 volt, delivering 4.3 volt as the reference voltage Ref.

The detection signal REN outputted from the level detecting part 30 traces the level of the high voltage to the reference voltage, the high voltage being outputted by an ON/OFF operation of the ring oscillator 10. The level of the high voltage outputted through the high voltage generator is maintained relatively low compared to a conventional case, by controlling the reference voltage level of the level detecting part. The invention, therefore, prevents the high voltage generator from outputting a high voltage higher than a regularized level alleviating a gate oxide film punch through phenomenon due to breakdown excessive stress during wafer burn-in.

In shortening a test time by heightening the outside power voltage in the test mode, semiconductor device instability due to high voltage is likewise reduced.

Referring to FIG. 6, where the level of the reference voltage Ref is lower than a level of a feedback output high voltage VPP and where the reference voltage Ref is lower than the threshold voltage of an N-type MOS transistor NM10, the transistor NM10 is turned on. A drain node of the transistor NM10 drops below the level of the high voltage VPP. A P-type transistor PM11 whose gate terminal is connected to a drain node of the transistor NM 10 is turned on, and the voltage at its drain node increases. An inverter IN10 outputs a low level detection signal. When the output signal REN of the inverter IN10 is at a low level, the clock oscillation of the ring oscillator 10 is cut off cutting off the charge pump 20. By doing so, the high voltage VPP tracks the reference voltage Ref downwards.

Where the level of the reference voltage Ref is higher than the level of the feedback output high voltage VPP, the N-type MOS transistor NM11 is turned off. The drain node of the transistor NM10 maintains its VPP voltage. Thus, a P-type transistor PM11 is turned off and its drain node has no current supply. The current through an input node of the inverter IN10 is discharged through an N-type MOS transistor NM11, dropping the voltage level. The inverter IN10 outputs a high level detection signal initiating a charge pump operation. By doing so, the high voltage VPP tracks the reference voltage Ref upwards.

The present invention, therefore, maintains constant a voltage level in a specific mode such as a wafer burn-in test resulting in preventing of gate oxide film breakdown or punch through.

Figure 7:
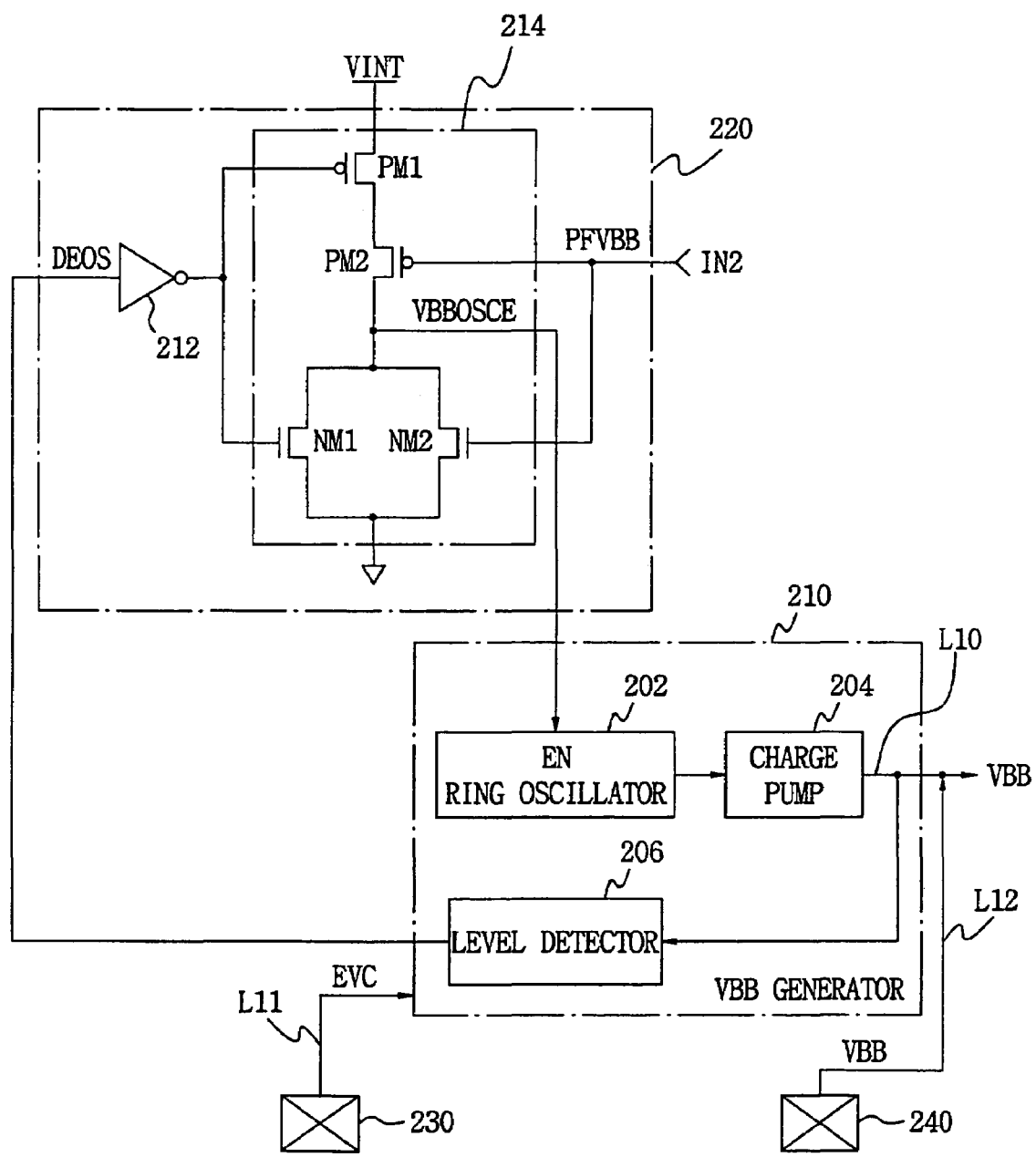
FIG. 7 is a block diagram of an embodiment of a negative drop voltage generator and associated control circuit of the present invention.

An embodiment negative drop voltage generator is as follows. According to the third exemplary embodiment, the negative drop voltage generator is turned off only during the wafer burn-in test, and an external negative drop voltage, provided through a negative drop pad VBB pad 240. The pad VBB PAD 240 is disposed inside a memory chip. Referring to FIG. 7, a negative drop voltage generator 210 generates a negative drop voltage VBB. An operation enable decision part 220 receives a control signal PFVBB through an input terminal IN2. The control signal PFVBB is generated during a burn-in test and cuts off operation of the negative drop voltage generator 210.

Once the negative drop generator 210 is cut off, the negative drop voltage VBB necessary for the burn-in test is applied externally directly to the required place through a VBB pad 240. The negative drop voltage VBB is not provided by the negative drop voltage generator 210. The operation enable decision part 220 includes an inverter 212 for inverting a detection signal DEOS outputted from a level detector 206, and a NOR gate 214 for logically NORing of a signal received through the inverter 212 and the signal PFVBB to thereby generate an operation enable detection signal VBBOSCE.

The NOR gate 214 includes a P-type MOS transistors PM1 and PM2 and N-type MOS transistors NM1 and NM2 connected as shown in FIG. 7.

Although the operation enable detection signal VBBOSCE is shown to disable the ring oscillator 202 of the negative drop voltage generator 210 in the drawing, a generation of other signals can cut off operation of the negative drop voltage generator including the charge pump or the level detector.

When the wafer burn-in test begins, a specific signal, the control signal PFVBB, is generated inside the chip. The control signal PFVBB is activated as logic "H" only when an operation of the negative drop voltage generator inside the chip is completely cut off in the test and a negative drop voltage of a determined level is then externally applied through the VBB pad. The control signal PFVBB can be applied from the outside of the chip by a mode register set command, and can be generated internally, automatically, through a use of a fuse option. Other methods of generating the control signal PFVBB are envisioned as coming within the scope of the present invention.

An operation of the negative drop voltage generator 210 and an operation of a test mode will be described with reference to FIG. 7.

During normal operation, a logic level of the control signal PFVBB is fixed at a low state. Thus, the negative drop voltage generator 210 is turned on or off depending upon an output state of the inverter 212. When the detection signal DEOS is a low level, an output of the inverter 212 becomes high. Signal is logically NORed with a low level of the control signal PFVBB resulting in a low level signal VBBOSCE. Therefore, the ring oscillator 202 of the negative drop voltage generator 210 does not output an oscillation signal for driving the charge pump 204. When the charge pump 204 does not perform a charge pumping operation, a level of the negative drop voltage VBB provided to a substrate through a line L10 rises in a positive direction.

When a level of the negative drop voltage VBB is a negative voltage higher than a predetermination level, the detection signal DEOS is outputted as a high level in the level detector 206. In this case, the output of the inverter 212 becomes low and such a result is the output of NOR gate 214 is get a high level since the control signal PFVBB is low. The ring oscillator 202 of the negative drop voltage generator 210 outputs an oscillation signal for driving the charge pump 204 when the operation enable detection signal VBBOSCE is high. The charge pump 204 performs a charge pumping operation responsive to the oscillation signal, to generate the negative drop voltage VBB. A level of the negative drop voltage VBB becomes low in a negative direction. This internally generated negative drop voltage VBB is applied to the substrate as a bias voltage.

When the negative drop voltage VBB of a predetermined level is applied only through the VBB pad 240 in the wafer burn-in test mode, the control signal PFVBB is high. The operation enable decision signal VBBOSCE becomes low regardless of a logic level of the detection signal DEOS, and the negative drop voltage generator 210 is turned off completely. In this case, the externally provided negative drop voltage VBB applied to the substrate as a bias voltage.

Though the negative drop voltage generator 210 was described for the case of being cut off responsive to a logic low state, it goes without saying that the negative drop voltage generator 210 can be cut off by applying any logic by appropriate manipulation of the circuit 220.

That is, during wafer burn-in, the negative drop voltage generator is cut off, so the negative drop voltage VBB can be externally applied directly through the negative drop voltage pad 240 from the outside. The result is a more stable negative drop voltage VBB applied as the substrate bias voltage to improve test coverage, in the third embodiment.

Figure 8:
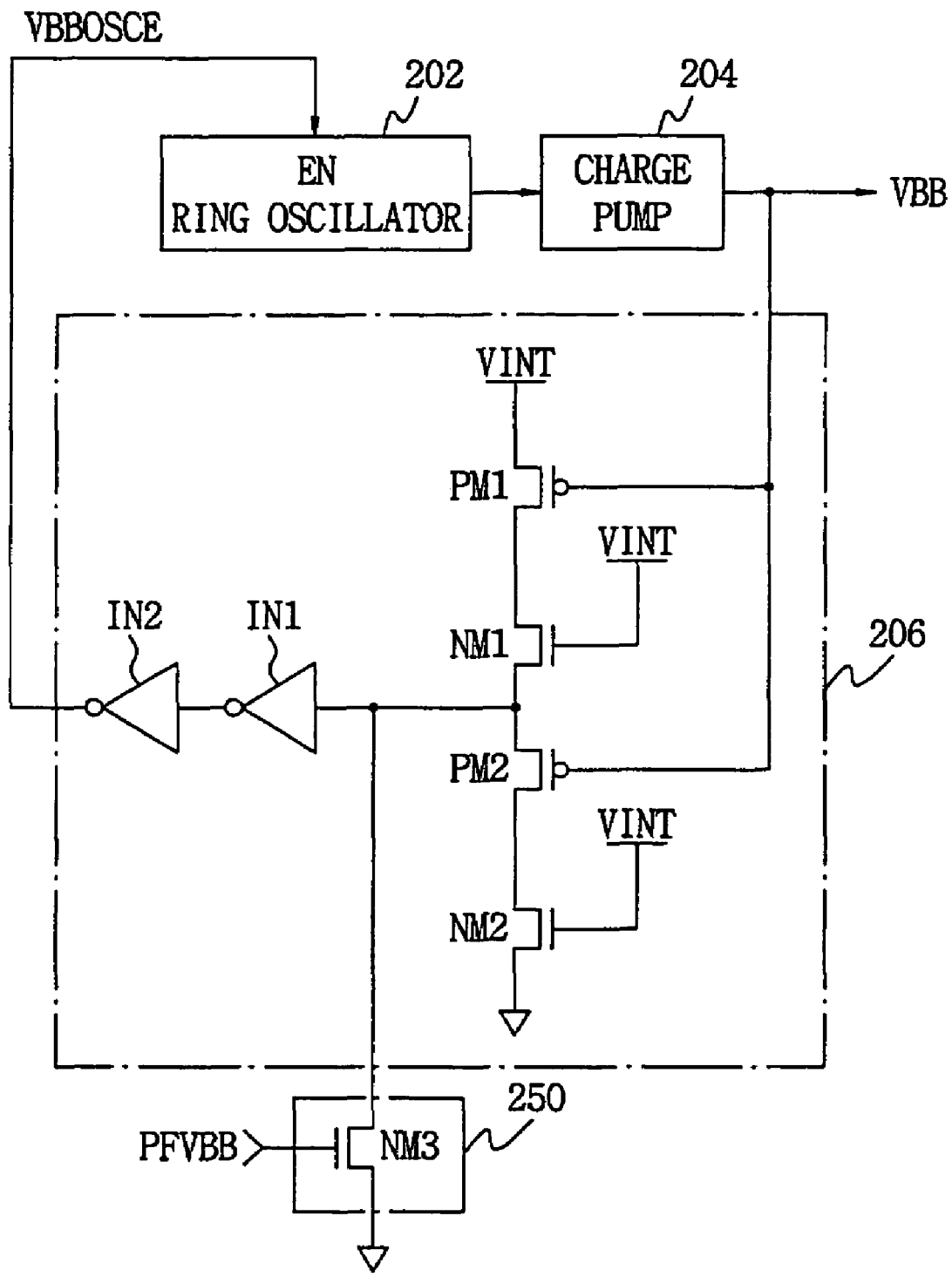
FIG. 8 is a circuit diagram of an embodiment of a negative drop voltage generator and associated controller of the present invention.

FIG. 8 is a diagram of the level detector shown in FIG. 7. Referring to FIG. 8, controller 250 controls an output of the level detector 206 of the negative drop voltage generator responsive to the control signal PFVBB. Thus, the negative drop voltage generator can be cut off allowing the negative drop voltage to be applied only externally through the VBB pad 240.

In one embodiment, the controller 250 is an N-type MOS transistor. A drain of the NMOS transistor NM3 is connected to an input terminal of an inverter IN1, and a source of the NMOS transistor NM3 is grounded. A gate of transistor NM3 receives the control signal PFVBB.

The controller 250 is turned on when a logic level of the control signal PFVBB is high, so as to fix the input terminal of the inverter IN1 as a low level. Thereby, the operation enable signal VBBOSCE of the level detector 206 of the negative drop voltage generator is fixed as a low level. Therefore, the ring oscillator 202 of the negative drop voltage generator 210 does not output the oscillation signal for driving the charge pump 204 when the operation enable signal VBBOSCE is at a logic low. The charge pump 204 is turned off when the control signal PFVBB is high, and the negative drop voltage generator 210 is completely cut off during the test mode. In this case the negative drop voltage forced outside can be, of course applied to the substrate through the negative drop voltage pad 240.

According to the embodiments described previously, during the burn-in test, an operation of the negative drop voltage generator is turned off, and a constant negative drop voltage is applied to the substrate through the negative drop voltage pad. Therefore, a uniform negative drop voltage can be provided to the substrate of a semiconductor memory device during the burn-in test to thereby improve test coverage and, ultimately device reliability.

Figure 9:
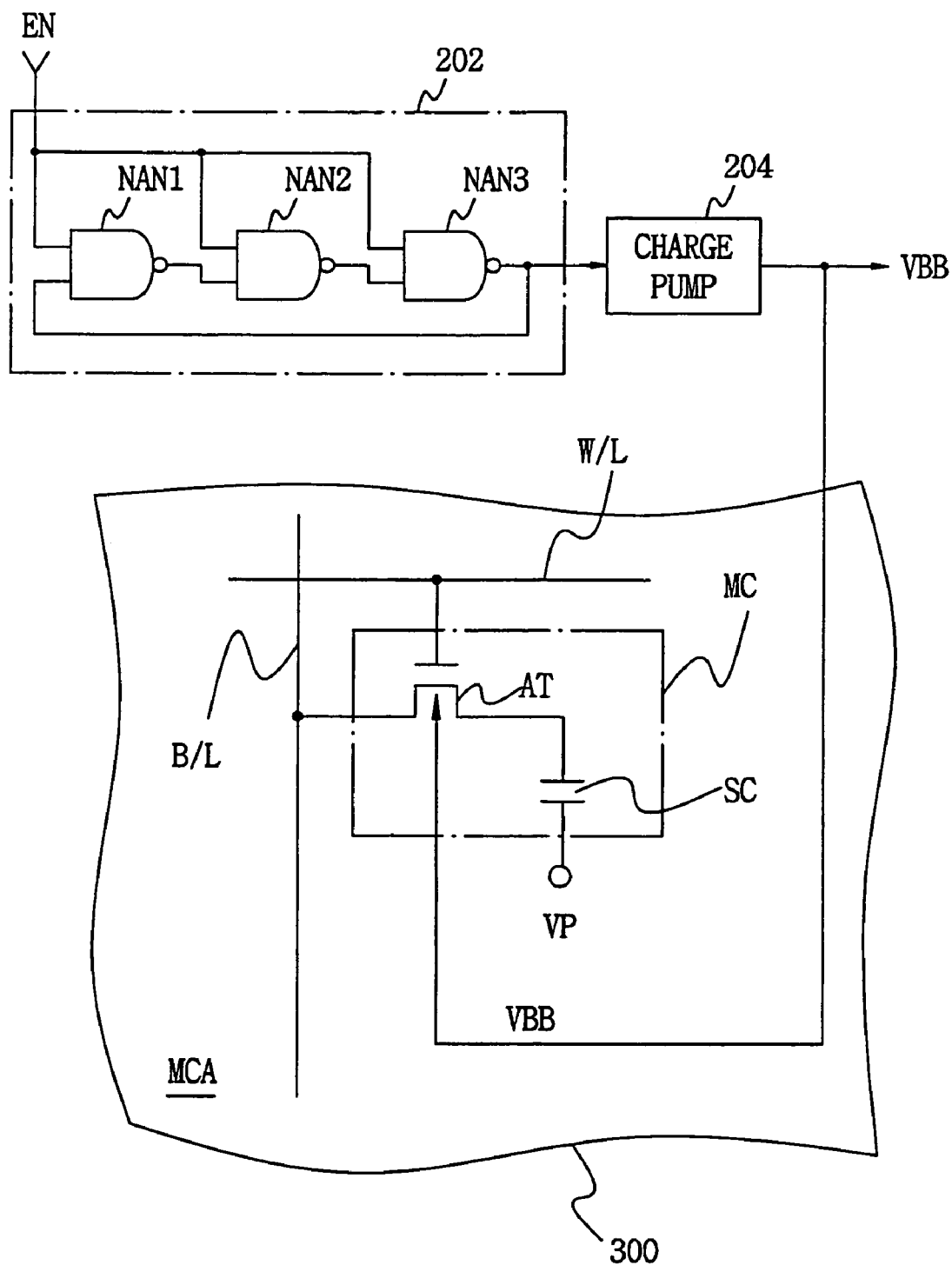
FIG. 9 is circuit diagram of an embodiment of a ring oscillator shown in FIGS. 7 and 8.

FIG. 9 is a block diagram of the ring oscillator shown in FIGS. 7 and 8.

Referring to FIGS. 8 and 9, the ring oscillator 202 is constructed of three serially connected NAND gates NAN1-NAN3. The negative drop voltage VBB generated in the charge pump 204 is sent as the substrate bias voltage to the substrate of an access transistor AT that constitutes each memory cell MC inside a memory cell array 300.

Figure 10:
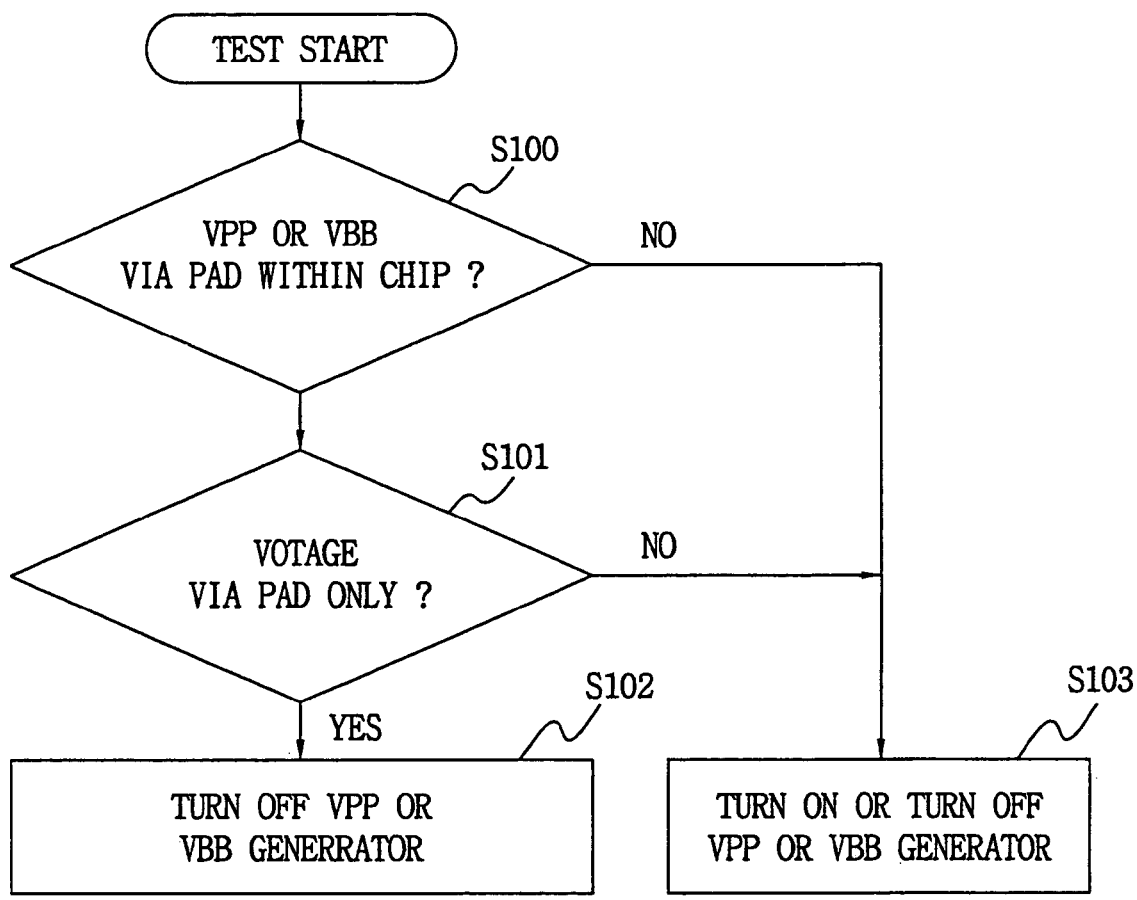
FIG. 10 is a flowchart of an embodiment of the method of the present invention.

FIG. 10 shows a flowchart of the methods of the present invention.

At box S100, the method determines whether the high voltage VPP or the negative drop voltage VBB are to be provided internally. If either voltage is provided internally, the method determines whether the voltages are to be provided external pad only (box S101). If so, the method turns off (or cuts off) the VPP or VBB generator accordingly (box S102). If not, the method turns on/off the VPP or VBB generator as appropriate (box S103).

As afore-mentioned, in accordance with the present invention, in a method of controlling a high voltage generator for use in a wafer burn-in test and a circuit for controlling an operation of the high voltage generator, a level of a high voltage can be uniformly maintained in a specific mode such as a wafer burn-in test thereby preventing destruction of a gate oxide film or a punch-through.

In addition during burn-in, an operation of a negative drop voltage generator is turned off, and a constant negative drop voltage can be applied to a substrate through a negative drop voltage pad. Accordingly, the negative drop voltage of a constant level can be provided to an overall substrate of a semiconductor memory device during the burn-in test. According to that, the negative drop voltage for use in a test coverage is provided with a uniform level to the substrate so as to improve a test reliability.

Having illustrated and described the principles of the invention, it should be readily apparent to those of skill in the art that the invention can be modified in arrangement and detail without departing from such principles. We claim all modifications coming within the scope and spirit of the accompanying claims.

We claim:

1. A method for controlling a high voltage generator having a level detector in a semiconductor memory device, comprising:
    generating an enable signal for enabling a high voltage generator responsive to a mode signal;
    controlling a reference voltage level of the level detector responsive to the enable signal; and
    varying a high voltage level being output from the high voltage generator in response to the reference voltage level.

2. The method of claim 1 wherein generating the enable signal includes generating the enable signal responsive to a wafer burn-in mode signal.

3. The method of claim 1 wherein controlling the reference voltage level comprises controlling the reference voltage level using at least one voltage drop element.

4. The method of claim 1 wherein controlling the reference voltage comprises controlling the reference voltage using serially connected P-type MOS diodes.

5. An apparatus in a semiconductor memory device, comprising:

a high voltage generator including a level detecting circuit adapted to compare a reference voltage with a high voltage and to generate a detection signal responsive to the comparison, the detection signal signaling the high voltage to track the reference voltage; and a reference level controlling circuit adapted to vary the reference voltage responsive to a mode signal.

6. The apparatus of claim 5 wherein the mode signal indicates a wafer burn-in test.

7. The apparatus of claim 6 wherein said reference level controlling circuit comprises:

a MOS transistor having a gate, a drain, and a source, the gate being adapted to receive the mode signal, the drain being adapted to receive the reference voltage, and the source being adapted to receive an original reference voltage; and a MOS diode string connected in parallel to the MOS transistor and adapted to drop a level of the original reference voltage responsive to the mode signal.

8. The apparatus of claim 7 wherein the reference level controlling circuit comprises:

a PMOS transistor having a gate, a drain, and a source, the gate being adapted to receive the mode signal, the drain being adapted to receive the reference voltage, and the source being adapted to receive an original reference voltage; and a resistive element connected in parallel to the PMOS transistor and adapted to drop a level of the original reference voltage responsive to the mode signal.

9. A semiconductor memory device, comprising:

a negative drop voltage generator adapted to generate a voltage lower than a normal voltage source;

a disabling circuit adapted to cut off the negative drop voltage generator responsive to a mode signal; and a pad adapted to receive an external voltage responsive to the disabling of the negative drop voltage generator.

10. The device of claim 9 where the negative drop voltage generator includes a level detector adapted to supply a detection signal;

where the disabling circuit comprises:

an inverter adapted to invert the detection signal; and a NOR gate adapted to logically NOR the inverted detection signal and the mode signal.

* * * * *

UNITED STATES PATENT AND TRADEMARK OFFICE
CERTIFICATE OF CORRECTION

PATENT NO. : 7,173,872 B2 Page 1 of 1
APPLICATION NO. : 11/327104
DATED : February 6, 2007
INVENTOR(S) : Choong-Sun Park et al.

It is certified that error appears in the above-identified patent and that said Letters Patent is hereby corrected as shown below:

Column 7, line 63, the word "NM11" should read -- NM10 --.

Signed and Sealed this

Second Day of September, 2008

JON W. DUDAS
*Director of the United States Patent and Trademark Office*